United States Patent [19]
Yamada et al.

[11] Patent Number: 5,997,398
[45] Date of Patent: *Dec. 7, 1999

[54] SEMICONDUCTOR WAFER STORAGE APPARATUS AND SEMICONDUCTOR DEVICE FABRICATING APPARATUS USING SAID APPARATUS

[75] Inventors: Yoshiaki Yamada; Hiroshi Watanabe, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/634,316

[22] Filed: Apr. 18, 1996

[30] Foreign Application Priority Data

Dec. 1, 1995 [JP] Japan .................................. 7-314068

[51] Int. Cl.$^6$ ....................................................... F24F 3/16
[52] U.S. Cl. ........................................... 454/187; 414/935
[58] Field of Search ............................ 454/187; 414/217, 414/222, 935, 940

[56] References Cited

U.S. PATENT DOCUMENTS

| | | | |
|---|---|---|---|
| 4,705,066 | 11/1987 | Gut et al. | 454/187 X |
| 4,867,629 | 9/1989 | Iwasawa et al. | 454/187 X |
| 5,303,482 | 4/1994 | Yamashita et al. | 34/80 |
| 5,431,600 | 7/1995 | Murata et al. | 454/187 |
| 5,434,644 | 7/1995 | Kitano et al. | 355/30 |
| 5,447,294 | 9/1995 | Sakata et al. | 266/257 |
| 5,527,390 | 6/1996 | Ono et al. | 414/940 X |
| 5,626,820 | 5/1997 | Kinkead et al. | 454/53 X |

FOREIGN PATENT DOCUMENTS

| | | | |
|---|---|---|---|
| 1-41561 | 3/1985 | Japan . | |
| 61-24933 | 2/1986 | Japan | 454/187 |
| 6-40512 | 2/1994 | Japan . | |
| 7-106406 | 4/1995 | Japan . | |

*Primary Examiner*—Harold Joyce
*Attorney, Agent, or Firm*—McDermott, Will & Emery

[57] ABSTRACT

A semiconductor wafer storage apparatus includes a wafer storage unit main body and a gas supply unit with a chemical filter, the gas supply unit being arranged independently of the wafer storage unit.

3 Claims, 7 Drawing Sheets

SEMICONDUCTOR WAFER STORAGE APPARATUS AND SEMICONDUCTOR DEVICE FABRICATING APPARATUS USING SAID APPARATUS

BACKGROUND OF THE INVENTION

The invention relates to semiconductor wafer storage apparatuses that protect semiconductor wafers from environmental pollution before and after each semiconductor fabricating process as well as to a semiconductor device fabricating apparatus to which such apparatuses are applied.

Amid progress in miniaturization and higher integration of semiconductor devices typically represented by memories, not only state-of-the-art processing techniques have been employed, but also the number of processing steps has been increased for their fabrication. Further, miniaturization demands a variety of measures to be taken to cope with various kinds of pollution affecting wafers under semiconductor fabrication processes.

Since pollution of the fabricating environment leads to a decrease in the yield of semiconductor devices, the semiconductor devices are produced within a clean room that is called by such designation as class 1, class 10, or the like defined in accordance with fabricating requirements.

While the fabrication of semiconductor devices involves a number of processes, it is required that wafers be temporarily stored in a clean room before and after each process. Therefore, wafers are stored in a wafer storage unit having an automated carrying function while contained in a number of wafer cassettes.

The size of the wafer storage unit is increased because of the need for a mass production of semiconductor devices and because of the fact that wafers are forwarded within the clean room through an overhead forward car or the like. That is, the wafer storage unit is 2 to 3 meters high in general.

An exemplary wafer storage unit, which is disclosed in the Examined Japanese Patent Publication No. Hei. 1-41561, will be described with reference to FIG. 8.

In FIG. 8, reference numeral 1 denotes a clean room that blows down clean air 4 from a ceiling 2 via a ULPA (ultra low penetration air-filter) filter 3 that is ordinarily used in clean rooms and sends the downwardly flowing air below the floor via a grated floor 5. Reference numeral 100 denotes a wafer storage unit; 6, a shelf; 7, a wafer cassette that contains a semiconductor wafer and that is accommodated in each compartment of the shelf 6; and 8, a wafer cassette 7 forward unit. In a shelf main body 9, filters 10 are arranged in the back of the shelf 6, and air supply units 11, each including a fan for supplying air 12 to the rear side of the wafer cassettes 7, are arranged below the main body 9. The wafer storage unit 100 is of the open type within the clean room while ventilated by the air supplied from the clean room.

An operation of the wafer storage unit will be described next.

During the operation of forwarding the wafer cassettes 7 to and from the shelf 6 by the forward unit 8, the clean air flows downwardly. The clean room not only sucks such downwardly flowing air from below the floor 5, but also supplies the clean air 12 past the filters 10 from the back of the shelf 6. As a result, entrance of dust from the forward unit 8 into the shelf 6 that contains the wafer cassettes 7 can be blocked.

As described above, the conventional wafer storage unit is designed to prevent semiconductor wafers from being contaminated by dust by means of the air that ventilates the clean room. However, the ULPA filter that is usually used in clean rooms cannot remove organic mists, moisture, and the like, and therefore the quality of semiconductor wafers has been adversely affected by the contamination derived from such substances.

Contamination has been brought about by the following substances.

(1) Organic Mists

Organic substances comprising elements such as phosphorus and boron separated and scattered around from the materials of which the clean room is constructed deposit on the semiconductor wafers within the wafer storage apparatus that is of the open type within the clean room. If such wafers are loaded into a diffusion furnace to be heated to high temperatures, the organic substances are also diffused into the wafers, thereby not allowing the desired semiconductor quality to be obtained.

(2) Moisture

Moisture within the clean room air that cannot be removed by the ULPA filter deposits on the wafers.

The depositing moisture forms naturally oxidized films on the semiconductor wafers. The thicknesses of such naturally oxidized films differ depending on the storage period, clean room environment, and the like.

Therefore, during the oxide film forming process which is one of the semiconductor fabricating processes, an oxide film having a desired thickness is formed on a naturally oxidized film having unspecified thickness, which makes the thicknesses of the oxide films nonuniform. As a result, higher performance and miniaturization needs for semiconductor devices cannot be met.

(3) Further, higher integration of semiconductors requires an excimer laser or the like be used as a light source in the lithographic process. If an organic substance is adsorbed on the resist of a stored wafer, a less-soluble layer is formed on the resist surface and the resist film is reduced, which deactivate the acid of the resist due to interaction between the organic substances and the laser beam. As a result, miniaturized patterning cannot be implemented.

The conventional wafer storage unit is of the open type within the clean room and is designed to protect semiconductor wafers from dust produced by the operation of the forward unit within the wafer storage apparatus by ventilating the clean room by the clean room air. However, organic mists that cannot be removed by the ULPA filter that is usually employed in clean rooms affect the quality of products by, e.g., depositing on semiconductor wafers and being diffused into the substrate in the following process, or by impairing patterning in the lithographic process. Further, moisture causes an oxide film of unspecified thickness to be formed to affect the quality of products. Still further, the semiconductor fabricating equipment entails large investment, which has imposed a great burden on the part of the manufacturer.

SUMMARY OF THE INVENTION

The invention has been made to overcome the aforementioned problems.

The object of the invention as recited in aspects 1 to 7 is to prevent the deposition of organic substances and moisture or the deposition of dust from the wafer storage unit on wafers stored in the clean room.

The object of the invention as recited in aspect 8 is to not only reduce the cost of construction but also improve the quality and yield of semiconductor devices by incorporating semiconductor wafer storage apparatuses in a semiconductor fabricating line, each semiconductor wafer storage apparatus being designed to keep organic substances and moisture from depositing on the stored wafers during a predetermined process.

A semiconductor wafer storage apparatus as recited in aspect 1 includes: a semiconductor wafer storage unit installed within a clean room; and a gas supply unit having a chemical filter, the gas supply unit being arranged independently of the semiconductor wafer storage unit.

A semiconductor wafer storage apparatus as recited in aspect 2 includes: a semiconductor wafer storage unit installed within a clean room; and a gas supply unit having a chemical filter, the gas supply unit being arranged independently of the semiconductor wafer storage unit. The semiconductor wafer storage unit has therein a gas supply chamber having a ULPA filter and a fan, and a means for returning part of a gas supplied from the gas supply unit to the gas supply chamber through a return duct and the fan.

A semiconductor wafer storage apparatus as recited in aspect 3 includes: a semiconductor wafer storage unit installed within a clean room; and a gas supply unit having a chemical filter, the gas supply unit being arranged independently of the semiconductor wafer storage unit. The semiconductor wafer storage unit has wafer cassette transfer machine ports and a delivery port, and the respective ports have load lock mechanisms, so that infiltration of the air within the clean room into the wafer storage apparatus is prevented while the wafers are being forwarded.

A semiconductor wafer storage apparatus as recited in aspect 4 is characterized in that a semiconductor wafer storage unit has a differential pressure gauge and an exhaust port opening/closing adjusting mechanism operated by a signal generated by the differential pressure gauge so that a pressure within the semiconductor wafer storage unit is kept higher than a pressure within the clean room.

A semiconductor wafer storage apparatus as recited in aspect 5 includes: a semiconductor wafer storage unit installed within a clean room; and a gas supply unit having a chemical filter, the gas supply unit being arranged independently of the semiconductor wafer storage unit. The semiconductor wafer storage unit has therein a gas supply chamber having a ULPA filter, a fan, and a return duct; wafer cassette transfer machine ports and a delivery port, each port having a load lock mechanism; a differential pressure gauge; and an exhaust port opening/closing adjusting mechanism operated by a signal generated from the differential pressure gauge.

A semiconductor wafer storage apparatus as recited in aspect 6 is characterized in that the gas supplied from the gas supply unit having the chemical filter is dry air.

A semiconductor wafer storage apparatus as recited in aspect 7 is characterized in that the gas supplied from the gas supply unit having the chemical filter is dry nitrogen.

A semiconductor device fabricating apparatus as recited in aspect 8 is characterized in that a semiconductor wafer storage apparatus in which a gas is supplied to a semiconductor wafer storage unit from a gas supply unit that is arranged independently of the wafer storage unit, and a semiconductor wafer storage apparatus in which the semiconductor wafer storage unit is ventilated by air supplied from the clean room are arranged in a semiconductor device fabricating line in accordance with fabricating processes.

DETAILED DESCRIPTION OF THE PREFERRED EMBODIMENTS

Embodiments of the invention will now be described with reference to the drawings.

(Embodiment 1)

Figure 1:
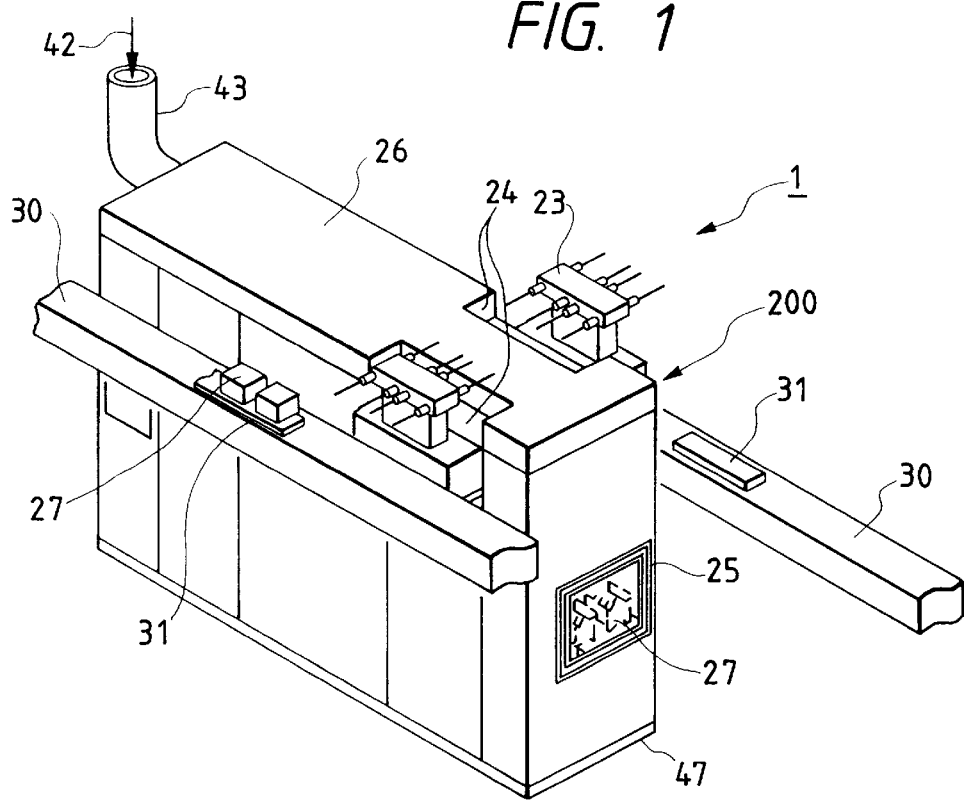
FIG. 1 is a perspective view of a wafer storage unit main body of a semiconductor wafer storage apparatus, which covers the contents of Embodiments 1 to 3 of the invention.
Figure 2:
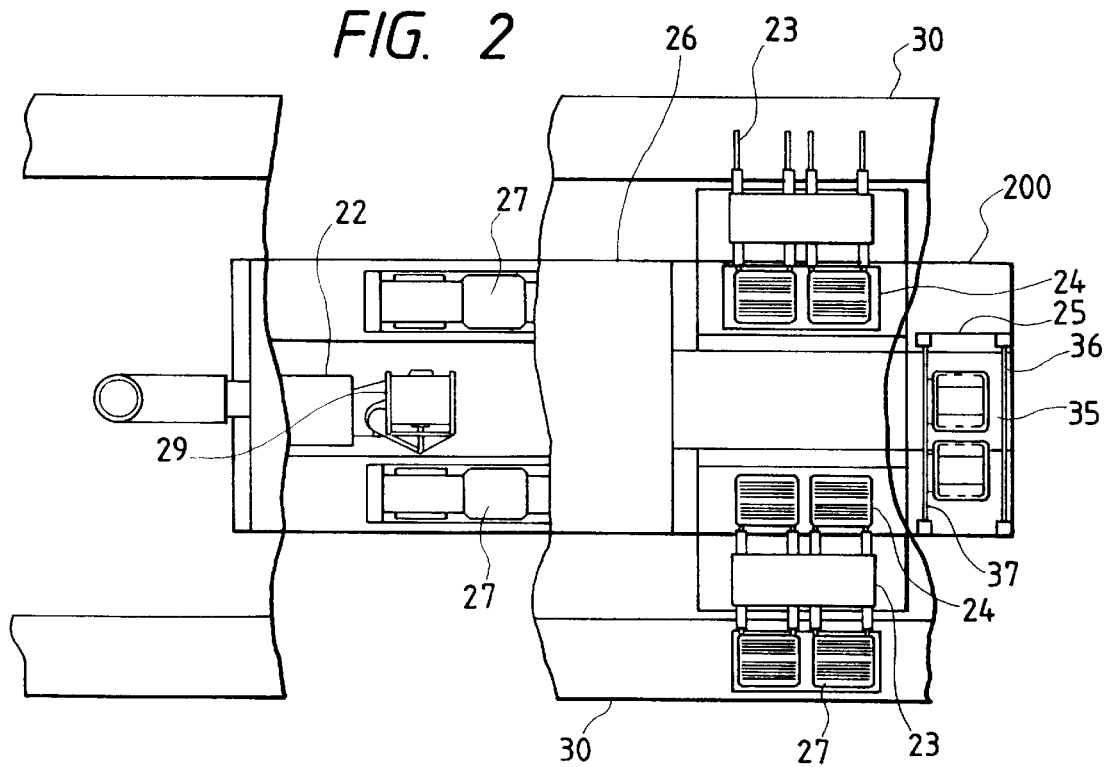
FIG. 2 is a plan view of the storage unit main body shown in FIG. 1.
Figure 3:
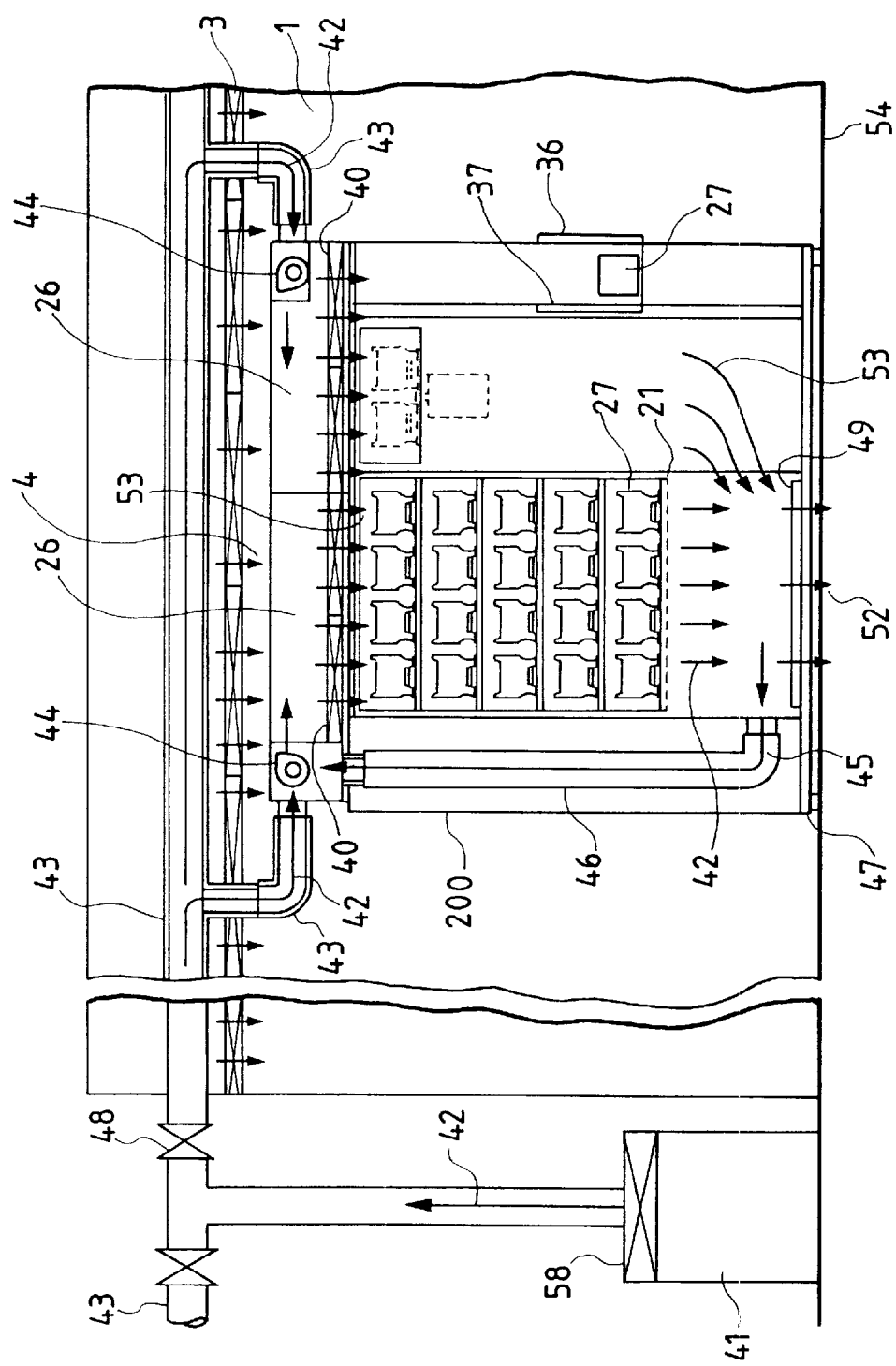
FIG. 3 is a frontal sectional view of the semiconductor wafer storage apparatus.
Figure 4:
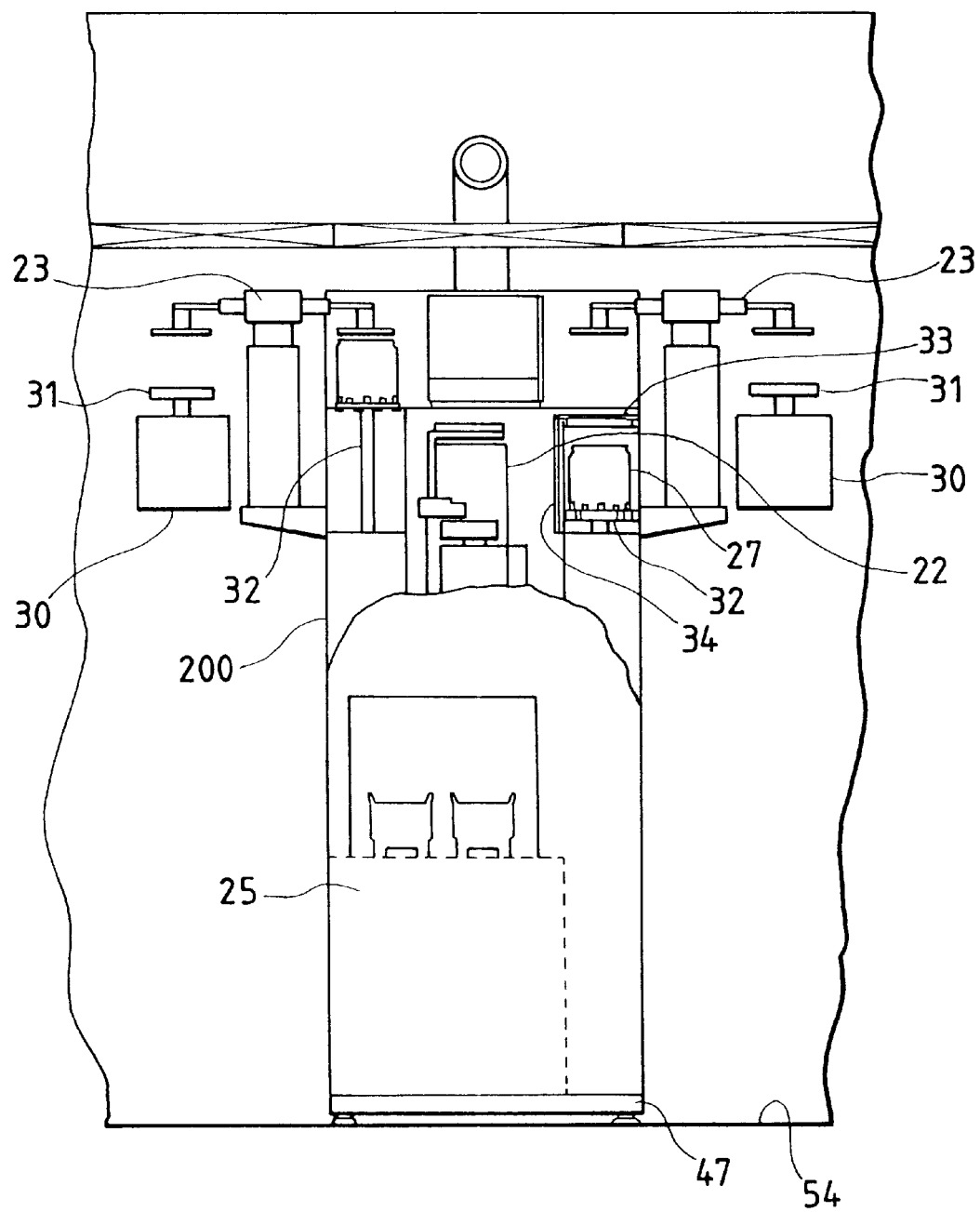
FIG. 4 is a frontal sectional view of the storage unit main body shown in FIG. 1.

FIG. 1 is a perspective view of a wafer storage unit main body of a semiconductor wafer storage apparatus, which is Embodiment 1 of the invention; FIG. 2 is a plan view of the storage unit main body shown in FIG. 1; FIG. 3 is a frontal sectional view of the wafer storage unit main body of the semiconductor wafer storage apparatus, the wafer storage unit main body including an independent gas supply unit; FIG. 4 is a frontal sectional view of the wafer storage unit main body; and FIG. 5 is a side sectional view of FIG. 4.

In FIGS. 1 to 5, a wafer storage unit main body 200 installed in a clean room 1 mainly includes: wafer cassette shelves 21 shown in FIG. 3 that accommodate wafer cassettes 27, each wafer cassette containing a wafer therein; a wafer cassette forward unit 22 shown in FIG. 4; transfer machines 23 shown in FIGS. 1 and 4; transfer machine ports 24 and a delivery port 25 shown in FIGS. 1 and 2; and a gas supply chamber 26 shown in FIGS. 1 to 3. The wafer storage unit main body 200 is covered with a not shown protecting cover, so that the parts and components inside the storage unit main body 200 are not exposed directly to the clean room environment. While the conventional storage unit is of the open type within the clean room, Embodiment 1 is of the closed type.

Figure 5:
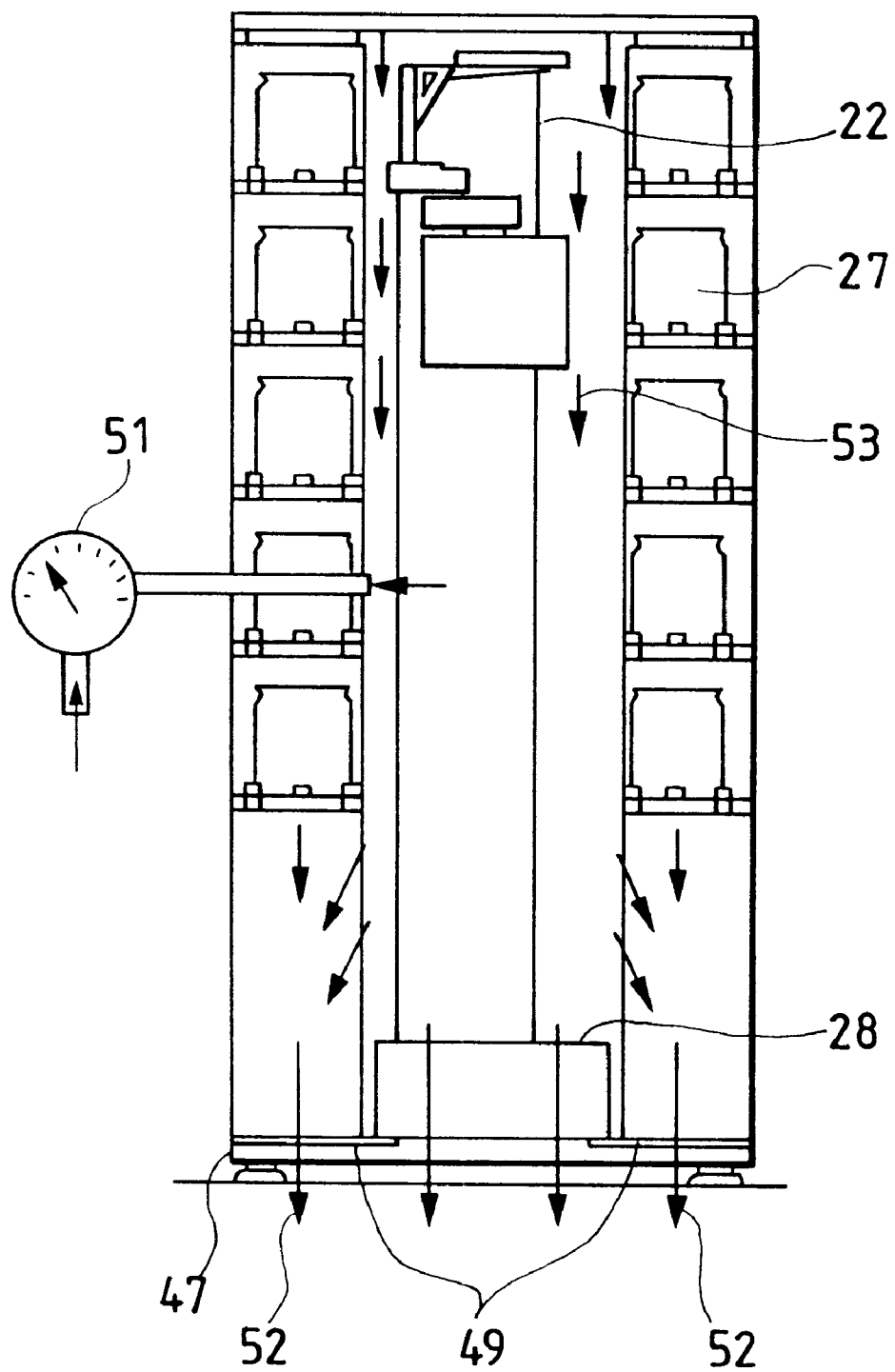
FIG. 5 is a side sectional view of FIG. 4.

As shown in FIGS. 3 and 5, the wafer cassette shelves 21 that are installed so as to confront each other can accommodate a plurality of wafer cassettes 27 vertically as well as horizontally. As shown in FIG. 3, a gas supply unit 41 having a chemical filter 58 is arranged independently of the wafer storage unit 200. A commercially available chemical filter manufactured, e.g., by Toray Industries or Dow Corning Silicone Corporation is used as the chemical filter 58. A gas 42 from the gas supply unit 41 is sent to a plurality of wafer storage units via a duct 43.

As shown in FIG. 5, the wafer cassette forward unit 22 moves over a travelling rail 28 mounted along the shelves 21 so as to automatically forward the wafer cassettes 27 between the shelves 21 and the transfer machine ports 24 or the deliver port 25.

A plurality of wafer storage unit main bodies 200 are installed within the clean room 1. Each wafer cassette 27 is forwarded by an overhead forward car 31 that travels along a rail 30 installed to the clean room ceiling shown in FIG. 1 and moves from one wafer storage unit main body 200 to another, so that wafer cassettes 27 are delivered to and from the wafer storage unit main bodies 200 by the transfer machines 23 and carried on the transfer machine ports 24.

As shown in FIG. 3, within the gas supply chamber 26 is a ULPA filter 40. The gas 42 sent via the duct 43 from the independently arranged gas supply unit 41 has the pressure thereof boosted and is blown out of the ULPA filter 40 at a wind velocity of, e.g., 0.3 m/s consistently.

The chemical filter 58 is arranged outside the gas supply unit 41. The chemical filter 58 generally has a short effective life and therefore requires frequent replacement. However, since the chemical filter is not arranged within the wafer storage unit main body 200 but arranged outside the gas supply unit 41 that is independent of the main body 200, the chemical filter can be replaced easily and is unaffected by the dust produced at the time of replacing semiconductor wafers and other parts and units. This is an excellent advantage.

Further, the gas 42 supplied from the gas supply unit 41 includes, in addition to clean room air, dry nitrogen and dry air selected in accordance with storage environment requirements of the wafer processes and purged from an accessory of the gas supply unit. The gas 42 is not limited to the ones listed above, but may be selected appropriately from inert gases as well.

The gas 53 blown out of the gas supply chamber 26 flows along the following three paths. The first path is such that the gas 53 flows first through the stored wafer cassette 27 section and then through not shown exhaust ports out into the clean room 1 as the exhaust gas 52 in down flow, the exhaust ports being arranged in a base 47. The second path is such that the gas 53 flows first through the forward unit 22 section and then through the not shown exhaust ports in down flow. The third path is such that the gas 53 returns to the gas supply chamber 26 while caused to enter into a return duct 46 by a fan 44. The thus obtained return gas 45 is mixed with the gas 42 sent from the gas supply unit 41, and flows again through the three paths via the gas supply chamber 26. While the dust mainly produced by the forward unit during the operation of the forward unit is also sent into the gas supply chamber 26 simultaneously therewith, such dust is eliminated by the ULPA filter 40.

The amount of the gas 52 to be supplied to the wafer storage unit main body 200 can be made larger than the amount of the gas 42 sent out of the gas supply unit 41 because of the return duct 46. Therefore, the capacity of the gas supply unit 41 can be reduced. Further, by adjusting a valve provided in the duct 43, the amount of gas supplied is also adjusted among the plurality of wafer storage unit main bodies 200, which in turn contributes to defining the amount of gas suitable for wafer storage.

While the example in which the gas supply unit 41 is arranged outside the clean room 1, e.g., in a utility area, has been described, the invention is not limited to such example. The gas supply unit 41 may be arranged in a clean room whose cleanliness class is lower than that of the clean room 1. That is, the gas supply unit 41 can be arranged in a place where the dust produced by the gas supply unit 41 itself and the dust produced at the time of replacing the chemical filter do not negatively affect the semiconductor fabricating apparatus and the wafers.

According to Embodiment 1, the wafer storage unit is installed within the clean room, and not only the gas supplied from the gas supply unit, which has the chemical filter and is arranged independently of the wafer storage unit, is supplied to the wafer section without containing organic substances and moisture, but also part of the exhaust gas thereof can be recirculated through the return duct.

Thus, the gas with the organic substances and moisture in the clean room air which have not been eliminated by the conventional ULPA filter removed by the chemical filter of the gas supply unit is supplied to the wafer storage unit. Therefore, no organic substances deposit on the surface of each wafer in storage, which in turn contributes to eliminating the diffusion of the organic substance into the substrate during the thermal diffusion process and other treatment. In addition, no organic substance deposits on the resist film, which in turn prevents the forming of a less-soluble layer on the resist film as well as the reduction of the resist film due to laser beams during the lithography process. Still further, the fact that no moisture deposits contributes to preventing the forming of a naturally oxidized film of unspecified thickness during storage and allowing the forming of an oxide film of a desired thickness during the oxide film forming process, which is one of the semiconductor device fabricating processes. Hence, high quality and high yield of semiconductor devices can be achieved.

(Embodiment 2)

As shown in FIGS. 2 to 4, each transfer machine port 24 has an outer door 33 and an inner door 34. The outer door 33 is arranged on the outside of a cassette carrying stage 32 (on the side of the clean room). The inner door 34 is arranged on the inside of the stage 32 (on the side of the wafer storage unit main body). Further, as shown in FIG. 2, the delivery port 25 has an outer door 36 and an inner door 37. The outer door 36 is arranged on the outside of a cassette carrying stage 35 (on the side of the clean room). The inner door 37 is arranged on the inside of the stage 35 (on the side of the wafer storage unit main body).

A load lock mechanism is attached to each of these doors so that the air within the clean room will not enter into the wafer storage unit when a wafer cassette 27 is delivered to and from a wafer storage unit main body 200. The load lock mechanism automatically opens and closes the door. That is, if, e.g., a cassette is to be delivered to the storage unit, the mechanism automatically performs a series of operations of: keeping the inner doors 34, 37 closed until the cassette is carried on the port by opening the outer doors 33, 36; closing the outer doors 33, 36 thereafter; and then opening the inner doors 34, 37 to deliver the cassette to the storage unit, for example.

Therefore, the clean room air containing organic substances and moisture enters in no way into the wafer storage unit main body 200, which hence keeps organic substances and moisture from depositing on the surfaces of the stored wafers.

(Embodiment 3)

As shown in FIG. 3, the wafer storage unit main body 200 is placed on the base 47 on the grated floor 54 of the clean room. Not only the wafer storage unit main body 200 is enclosed by the not shown protecting cover, but also a not shown blind patch is arranged on the base 47 except the bottom of the cassette shelves 21. On the bottom of the cassette shelves 21 is a gas exhaust port opening/closing adjusting mechanism 49. This mechanism 49 adjusts the amount of downwardly flowing gas 52. Such adjustment is made by automatically opening and closing downwardly flowing gas 52 outlets (exhaust ports) using a signal from a differential pressure gauge (to be described later) so that the area of the downwardly flowing gas 52 exhaust ports can be increased and decreased. For example, a mechanism to finely adjust the angles of a plurality of grated fins with respect to the exhaust ports, or a mechanism to allow two slitted upper and lower plates to slide differentially in opposite directions are applicable.

Still further, as shown in FIG. 5, the differential pressure gauge 51 is arranged.

This differential pressure gauge 51 senses a difference between the pressure within the wafer storage unit main body 200 and the pressure within the clean room and generates a signal for adjusting the exhaust port opening/closing adjusting mechanism so that the pressure within the wafer storage unit main body 200 is always higher than the pressure within the clean room.

The exhaust port opening/closing adjusting mechanism and the differential pressure gauge are arranged and the opening/closing of the exhaust ports is automatically adjusted in accordance with an instruction given by the differential pressure gauge. Therefore, the pressure within the wafer storage unit main body 200 can always be kept higher than the pressure within the clean room. As a result, the clean room air does not infiltrate into the wafer storage unit main body, thereby providing the excellent advantage that no organic substances and moisture deposit on the stored wafers and therefore that the quality of the semiconductor devices is not impaired. It may be noted that the pressure difference at this instance preferably ranges approximately from 0.5 to 1 mm $H_2O$.

(Embodiment 4)

Figure 6:
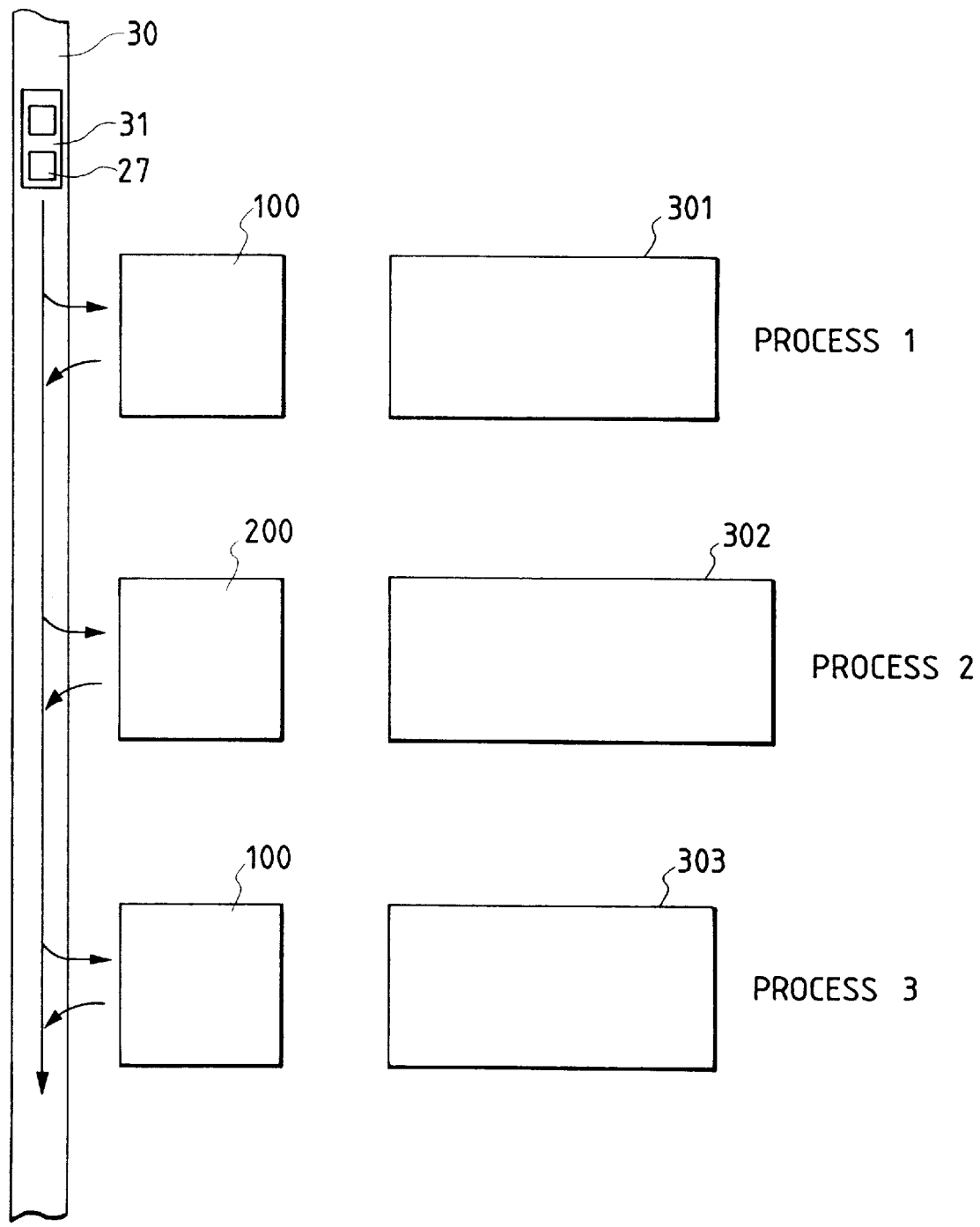
FIG. 6 is a conceptual layout illustrative of Embodiment 4 in which the semiconductor wafer storage apparatuses, which are Embodiments 1 to 3, are employed in a semiconductor fabricating line.
Figure 8:
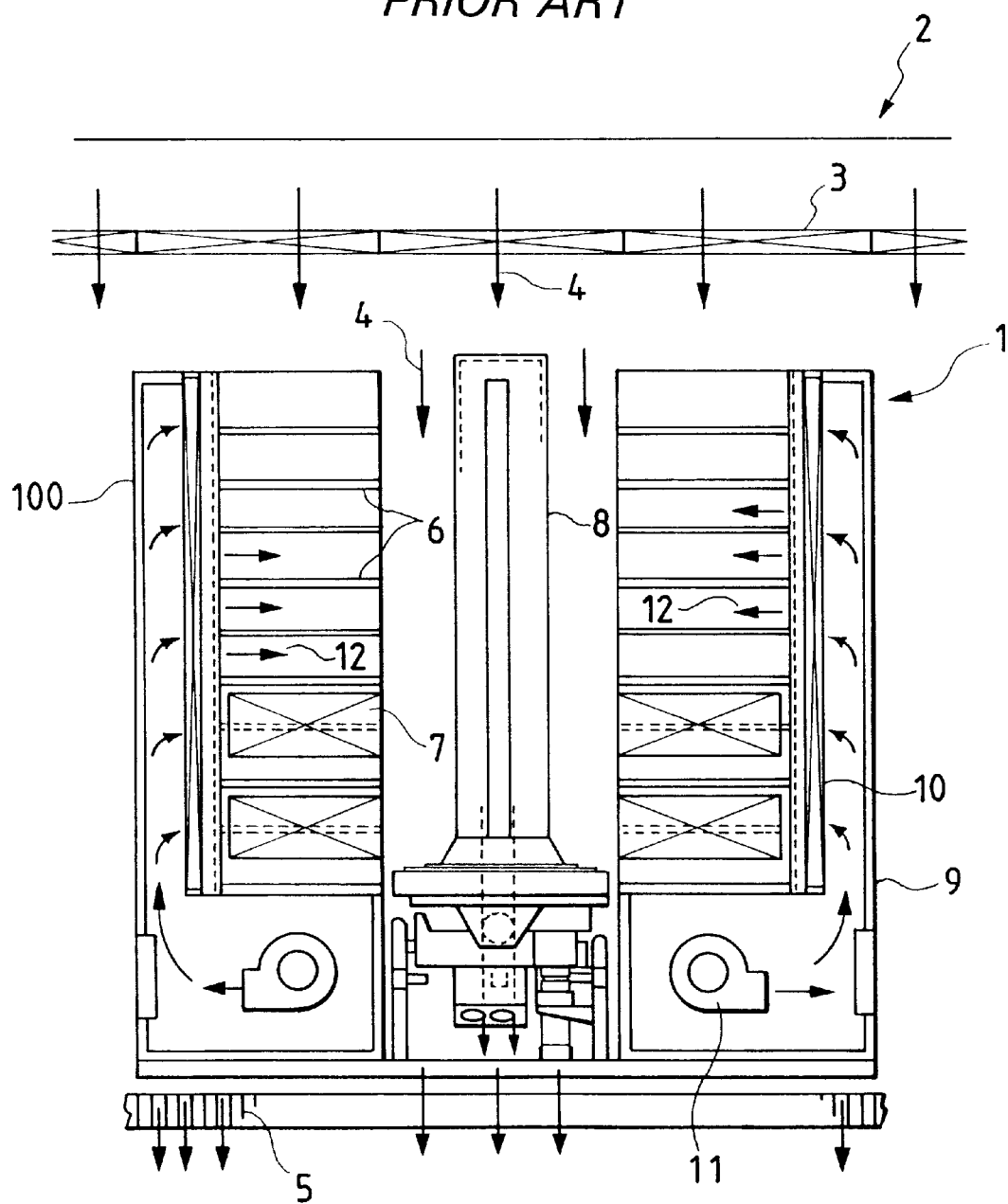
FIG. 8 is a diagram showing a conventional wafer storage unit.

FIG. 6 is a conceptual layout in the form of a plan view illustrative of the wafer storage unit main bodies 200, which are Embodiments 1 to 3, and the conventional wafer storage unit 100 employed in a semiconductor fabricating line. Reference numeral 100 denotes the wafer storage unit described reference to FIG. 8. The wafer storage unit 100 sends the clean room air to the main body to ventilate the main body. In the semiconductor fabricating line, the forward car 31 moves along the travelling rail 30 so as to forward wafer cassettes 27 from one wafer storage unit 100, 200 to another.

Reference numerals 301, 302, 303 denote semiconductor fabricating apparatuses, each of which includes: a diffusion furnace, a resist coater, a stepper, a dryer, a wet etcher, an asher, an ion implanter, and a CVD (chemical vapor deposition) apparatus, for example. Processes 1 to 3 are performed by using these apparatuses. While the semiconductor device fabrication involves these three processes, from process 2 the impairment of quality and the reduction of yield arises as a result of organic substances and moisture within the clean room depositing on the surface of a stored semiconductor wafer, whereas from processes 1, 3 no such negative effects noticeably arises.

For reducing the cost of construction and operation and for optimizing quality in semiconductor fabrication, wafer storage unit main bodies that meet respective process requirements are arranged in Embodiment 4.

In FIG. 6, a semiconductor device is, e.g., contained in a conventional wafer storage unit 100 upon completion of process 1 by the fabricating apparatus 301, contained in a wafer storage unit main body 200 shown as Embodiments 1 to 3 by the forward car 31 swiftly thereafter, and stored therein until a wafer delivery request is made by the fabricating apparatus 302 of process 2. After the wafer delivery request has been made by process 2, the semiconductor wafer delivered from the wafer storage unit main body 200 is subjected to a treatment according to process 2 within the semiconductor fabricating apparatus 302. Upon completion of the treatment according to process 2, the semiconductor wafer is returned to the wafer storage unit main body 200 again and is thereafter forwarded to the wafer storage unit main body 100 for process 3, which is a next process.

Such fabricating processes can provide an environment meeting more stringent requirements over cleanliness class, humidity, the kind of gas purged, and the like more economically than an ordinary clean room can. That is, these fabricating processes do not require that the environment of a clean room be such a special environment as described above as a whole but require that the wafer storage units of the invention be merely arranged as appropriate. Therefore, these fabricating processes are economical.

(Embodiment 5)

Figure 7:
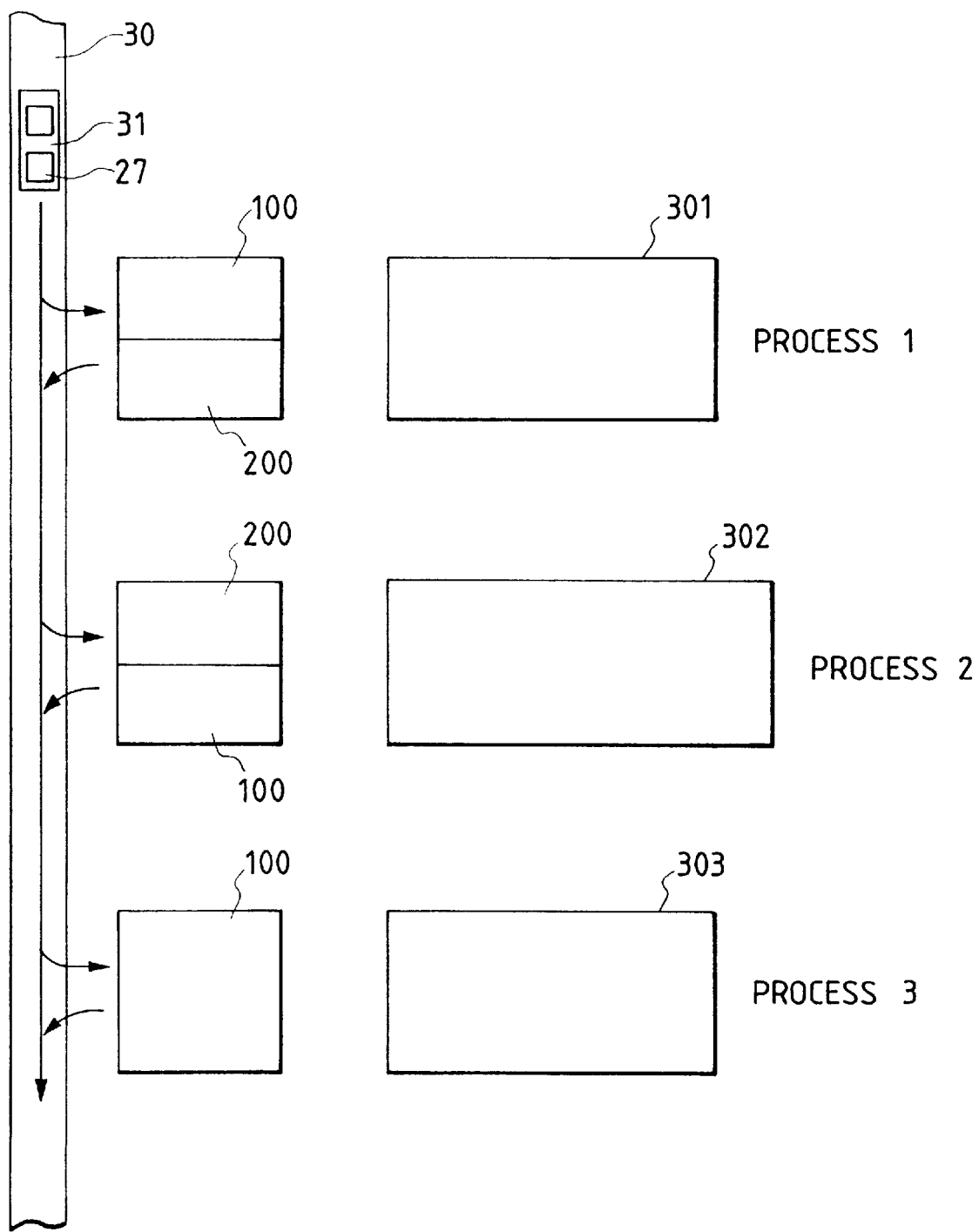
FIG. 7 is a conceptual layout illustrative of Embodiment 5 similar to FIG. 6.

The example in which the wafer storage unit 100 or 200 is installed to each of the semiconductor fabricating apparatuses 301, 302, 303 has been described in Embodiment 4. However, one conventional wafer storage unit 100 and one wafer storage unit 200 of the invention may be installed to one fabricating apparatus in accordance with the tact time of the fabricating line and the storage environment requirements of the next processes as shown in FIG. 7, so that better quality can be ensured.

It goes without saying that the invention is not limited to the aforementioned embodiments. The invention covers embodiments considered to be substantially equivalent to those within the scope of the aspects thereof.

According to the semiconductor wafer storage apparatus as recited in aspect 1, the clean room air is supplied via the chemical filter of the gas supply unit that is independent of the semiconductor wafer storage unit. Therefore, organic substances and moisture do not deposit on wafers. Hence, unwanted organic substances are not diffused into the semiconductor devices, nor is an oxide film of unspecified thickness formed to thereby allow stable film forming process to be implemented. As a result, not only high quality semiconductor devices can be obtained, but yield can be improved as well. Further, the chemical filter can be replaced with ease, which prevents the dust produced during the replacement from affecting the semiconductor fabricating line.

According to the semiconductor wafer storage apparatus as recited in aspect 2, organic substances and moisture do not deposit on the wafers, and the capacity of the gas supply unit can be reduced.

According to the semiconductor wafer storage apparatus as recited in aspect 3, air within the clean room does not enter into the storage unit main body when the wafers are delivered to and from the storage apparatus. Therefore, organic substances and moisture contained in the clean room air do not deposit on the stored wafers.

According to the semiconductor wafer storage apparatus as recited in aspect 4, the pressure within the storage unit main body is always kept higher to a predetermined value than the pressure within the clean room. Therefore, the air within the clean room does not enter into the storage unit main body, thereby preventing organic substances and moisture from depositing on the wafers.

According to the semiconductor wafer storage apparatus as recited in aspect 5, organic substances and moisture within the clean room do not deposit on the stored wafers. Therefore, high quality semiconductor devices can be obtained, and yield can be improved as well. Further, the filter can be replaced with ease, and the gas supply unit can also be downsized. Still further, the clean room air does not enter into the storage unit main body at the time of delivering the wafers.

According to the semiconductor wafer storage apparatus as recited in aspects 6 and 7, storage environment can be selected in accordance with the wafer storage requirements in each semiconductor fabricating process.

According to the semiconductor device fabricating apparatus as recited in aspect 8, a wafer storage environment only dedicated to a fabricating apparatus required by a process can be provided in accordance with a wafer storage environment requirement that is special compared with an ordinary clean room environment in the semiconductor fabricating processes. As a result, the cost of construction of the semiconductor device fabrication building and the cost of operation can be reduced.

What is claimed is:

1. A semiconductor device fabricating apparatus in a semiconductor device fabricating line, comprising:

a first semiconductor wafer storing means, installed within a clean room, in which a gas is supplied from a gas supplying means located independently of said semiconductor wafer storing means and exteriorly of the clean room;

a chemical filter removably attached to the outside of the gas supplying means; and a second semiconductor wafer storing means in which said semiconductor wafer storing means installed within the clean room is ventilated by air supplied from the clean room, wherein the second semiconductor wafer storing means is used before a semiconductor device has undergone a wet etching treatment and the first semiconductor wafer storing means is used after the wet etching treatment.

2. A semiconductor device fabricating system, comprising:

a first semiconductor wafer storage device installed within a clean room, in which a gas is supplied from a gas supplying means located exterior to the clean room;

a chemical filter removably attached to the outside of the gas supplying means; and a second semiconductor wafer storage device installed within the clean room and which is ventilated by air supplied from the clean room, wherein the first and second semiconductor wafer storage devices are coupled together and located adjacent to a semiconductor fabricating device, wherein one of said first and second semiconductor wafer storage devices is used before treatment by a wafer treatment device and the other of said first and second semiconductor wafer storage devices is used after treatment by the wafer treatment device.

3. The semiconductor device fabricating system of claim 2, wherein the first semiconductor wafer storage device is used after treatment by the wafer treatment device, and the second semiconductor wafer storage device is used before treatment by the wafer treatment device.

* * * * *